United States Patent
Ruppi et al.

(10) Patent No.: US 6,620,498 B2
(45) Date of Patent: Sep. 16, 2003

(54) COATED BODY WITH NANOCRYSTALLINE CVD COATING FOR ENHANCED EDGE TOUGHNESS AND REDUCED FRICTION

(75) Inventors: Sakari Ruppi, Fagersta (SE); Lennart Karlsson, Fagersta (SE)

(73) Assignee: Seco Tools AB, Fagersta (SE)

( * ) Notice: Subject to any disclaimer, the term of this patent is extended or adjusted under 35 U.S.C. 154(b) by 0 days.

(21) Appl. No.: 10/222,810

(22) Filed: Aug. 19, 2002

(65) Prior Publication Data

US 2003/0054159 A1 Mar. 20, 2003

Related U.S. Application Data

(63) Continuation of application No. 09/487,495, filed on Jan. 19, 2000, now Pat. No. 6,472,060.

(51) Int. Cl.$^7$ .................................... B22B 9/00
(52) U.S. Cl. ...................... 428/325; 428/698; 428/701; 428/702; 428/697
(58) Field of Search ................. 428/325, 698, 428/701, 702, 697

(56) References Cited

U.S. PATENT DOCUMENTS

| | | | |
|---|---|---|---|
| RE31,526 E | | 2/1984 | Smith et al. |
| 4,619,866 A | | 10/1986 | Smith et al. |
| 5,503,912 A | * | 4/1996 | Setoyama et al. ........... 428/216 |
| 5,700,551 A | * | 12/1997 | Kukino et al. ............... 428/698 |
| 5,712,030 A | * | 1/1998 | Goto et al. .................. 428/216 |
| 5,827,570 A | | 10/1998 | Russell |
| 5,915,162 A | * | 6/1999 | Uchino et al. ............... 428/698 |
| 5,972,495 A | * | 10/1999 | Ishii et al. ................... 428/336 |
| 6,221,469 B1 | * | 4/2001 | Ruppi .......................... 428/698 |
| 6,251,508 B1 | * | 6/2001 | Ruppi .......................... 428/699 |

FOREIGN PATENT DOCUMENTS

| | | |
|---|---|---|
| EP | 0 600 115 A1 | 6/1994 |
| EP | 0 678 594 A1 | 10/1995 |
| EP | 0 701 982 A1 | 3/1996 |
| EP | 0 816 531 A1 | 1/1998 |
| JP | 5-345976 | * 12/1993 |
| JP | 6-279990 | * 10/1994 |

OTHER PUBLICATIONS

Patent Abstracts of Japan, vol. 018, No. 203 (M–1590), Apr. 11, 1994, & JP 06 008010 A (Mitsubishi Materials Corp), Jan 18, 1994.
Patent Abstracts of Japan, vol. 1996, No. 04, Apr. 30, 1996, & JP 07 328810 A (Mitsubishi Materials Corp), Dec. 19, 1995.
Patent Abstracts of Japan, vol. 1997, No. 02, Feb. 28, 1997, & JP 08 269719 A (Mitsubishi Materials Corp), Oct. 15, 1996.

* cited by examiner

*Primary Examiner*—Archene Turner
(74) *Attorney, Agent, or Firm*—Burn, Doane, Swecker & Mathis, L.L.P.

(57) ABSTRACT

An improved coated body having a nanocrystalline CVD coating of Ti(C,N,O) is disclosed. The coating is formed using the MTCVD process and including, as part of the gaseous mixture, CO, $CO_2$ or mixtures thereof. The use of this dopant during the coating results in a much smaller, equiaxed grain size. The method of forming the body is also disclosed.

24 Claims, No Drawings

COATED BODY WITH NANOCRYSTALLINE CVD COATING FOR ENHANCED EDGE TOUGHNESS AND REDUCED FRICTION

This is a continuation of application Ser. No. 09/487,495, filed Jan. 19, 2000, now U.S. Pat. No. 6,472,060.

BACKGROUND OF THE INVENTION

Coated bodies for use in the cutting of metal are well-known. Typically, the bodies are made of a cemented carbide, cermet or ceramic and the coatings are one or more of a Group VIB metal carbide, nitride, oxide or mixtures thereof. For example, bodies of a cemented carbide coated with layers of TiC, $Al_2O_3$ and TiN are widely used. There are many variations in layer composition and thickness. The layers are applied by various methods such as CVD (chemical vapor deposition), both conducted at normal temperatures of from about 900 to 1250° C. and medium temperature chemical vapor deposition (MTCVD) conducted at temperatures of from about 700 to 900° C., and PVD (physical vapor deposition).

CVD TiC coatings are usually composed of equiaxed grains with the grain size being from about 0.5 to 1.0 microns. CVD TiN as well as MTCVD Ti(C,N) coatings are composed of columnar grains with the length of the grains approaching the coating layer thickness. The morphology of CVD coatings can be slightly modified by process adjustments. The MTCVD coatings are, however, very difficult to modify by conventional process adjustments.

The hardness of polycrystalline materials in general (including coating layers as well) obey the Hall-Petch equation: $H = H° + C/\sqrt{d}$ where H is the hardness of a polycrystalline material, H° is the hardness of a single crystal, C is a material constant and d is the grain size. As may be seen from this equation, the hardness of a material can be increased by decreasing the grain size. Nonetheless, conventional CVD and MTCVD coatings have grain sizes of at least 0.5 microns and above. MTCVD coatings are particularly characterized by the presence of large columnar grains with the length of the crystals approaching the thickness of the coating layer.

The use of a dopant such as a tetravalent titanium, hafnium and/or zirconium compound in the formation of an $Al_2O_3$ layer to promote the formation of a particular phase is shown in U.S. Reissue Pat. No. 31,526. Also, the use of a dopant selected from the group consisting of sulfur, selenium, tellerium, phosphorous, arsenic, antimony, bismuth and mixtures thereof to increase the growth rate of $Al_2O_3$ applied by CVD as well as to promote even layers of the coating is disclosed in U.S. Pat. No. 4,619,886.

$CO_2$ has been used as part of the coating process as well. In particular, it has been used in oxidizing processes where it reacts with $H_2$ to form $H_2O$, the oxidizing gas. See, for example, U.S. Pat. No. 5,827,570.

OBJECTS AND SUMMARY OF THE INVENTION

It is an object of this invention to avoid or alleviate the problems of the prior art.

It is further an object of this invention to provide a coating layer of significantly smaller grain size and concomitant hardness.

In one aspect of the invention there is provided a coated body having as a coating layer, a layer of Ti(C,N,O) having a grain size of 25 nm or less.

In another aspect of the invention there is provided a method of forming a coated body of Ti(C,N,O) comprising contacting a body with a gas containing titanium halide, a nitrogen compound, a carbon compound, a reducing agent and a dopant addition of CO and/or $CO_2$ sufficient to form the Ti(C,N,O) in a size less than 25 mm.

DETAILED DESCRIPTION OF THE PREFERRED EMBODIMENTS OF THE INVENTION

It has now been found that the grain size of coatings applied by MTCVD can be refined to much smaller grain size levels and to an equiaxed shape by adding small amounts of a dopant of CO or $CO_2$ or mixtures thereof, preferably CO, to the coating gas during the MTCVD process. In order to obtain a grain size of the resulting coating in the order of 25 nm or less, preferably 10 nm or less, the amount of CO in the MTCVD gaseous mixture should be from about 5 to 10%, preferably from about 7 to 9%, of the total gaseous mixture. When $CO_2$ is used, it should be present in an amount of from about 0.5 to 1.0%, preferably 0.4 to 0.6% of the total gaseous mixture. The CO and/or $CO_2$ dopant can be added at anytime throughout the reaction, continuously or in the interrupted mode. When $CO_2$ and/or $CO/CO_2$ mixtures are used, care should be taken within the skill of the artisan to avoid the formation of Magnelli phases.

While the dopant addition can be made to the reactant gas admixture used for various coating layers, it has found particular utility in the formation of a Ti(C,N,O) layer which would have been a Ti(C,N) layer in the absence of the dopant. In the Ti(C,N,O) layer, the ratio of constituents generally has been as follows: O/Ti from 0.10 to 0.40, preferably 0.20 to 0.30, C/Ti from about 0.40 to 0.60, preferably 0.50 to 0.60, and N/Ti from about 0.15 to 0.35, preferably 0.20 to 0.30. While a Ti (C,O,N) layer is preferred, the method of the present invention can be applied to form a Ti(C,O) layer which would have been a TiC layer in the absence of the dopant.

The nanocrystalline layer may be applied as the outermost layer or as an inner layer. As will be shown below, the nanocrystalline coatings are harder but exhibit at higher temperatures (at higher cutting speeds) grain boundary sliding leading to plastic deformation. Due to the extremely fine grain size of this coating, the surface smoothness is increased and friction coefficient is reduced. Consequently, nanocrystalline coatings obviously are acting as friction reducing/lubricating layers and should be consequently deposited atop of the existing coating structure. However, new coatings of MTCVD/CVD with alternating nanocrystalline layers (doping switched ON/OFF during MTCVD/CVD process, nanolayered structures of MTCVD/nanocrystalline layers are possible) should exhibit outstanding/new properties. The nanocrystalline layers could also be used in combination with other coating materials like alumina (kappa or alpha), or other oxides or TiN forming a nanolayered structure being composed of layers of MTCVD and nanograined coatings. Very thin nanocrystalline layers inserted in the MTCVD coatings can be used to control the grain size of the MTCVD coating when a coating composed of mainly Ti(C,N) is preferred. When used as the outermost layer, the nanocrystalline layer may be applied onto an $Al_2O_3$ layer, which itself can be applied onto one or more other layers such as, for example, TiC. The $Al_2O_3$ layer can be an alpha phase, a kappa phase or a mixture of alpha and kappa phase $Al_2O_3$. The nanocrystalline layer may also be applied onto a TiN layer.

Similarly, when the nanocrystalline layer is applied as an inner layer, there may be other layers such as $Al_2O_3$, TiC, Ti(C,N), TiN or the like applied atop the nanocrystalline layer.

These various other inner and/or outer layers may be applied by CVD, MTCVD or PVD.

By equiaxed, it is meant that the grains have essentially the same dimension in all directions.

The invention is additionally illustrated in connection with the following Examples which are to be considered as illustrative of the present invention. It should be understood, however, that the invention is not limited to the specific details of the Examples.

EXAMPLE 1

In this case CO doping was applied. The following five experimental coatings (referred to as coatings 1, 2, 3, 4 and 5) were produced at a pressure of 65 mbar according to the process data given in Table 1.

TABLE 1

| | $H_2$ (1/min) | $N_2$ (1/min) | $CH_3CN$ (1/min) | $TiCl_4$ (1/min) | CO % |
|---|---|---|---|---|---|
| Coating 1 | balance | 25 | 0.5 | 2 | 0 |
| Coating 2 | balance | 25 | 0.5 | 2 | 3 |
| Coating 3 | balance | 25 | 0.5 | 2 | 4 |
| Coating 4 | balance | 25 | 0.5 | 2 | 6 |
| Coating 5 | balance | 25 | 0.5 | 2 | 8 |

Grain Size

The coatings 1–5 were investigated using Transmission electron microscopy (TEM) in order to elucidate the effect of CO doping on the grain size. It appeared clear that the microstructure of the MTCVD Ti(C,N) coating being composed of large columnar crystals can be strongly refined by CO doping. The structure became nanocrystalline at a CO doping level of about 8%.

X-ray Diffraction (XRD)

Coatings 1, 3, 4 and 5 were studied by using XRD. The grain refinement is clearly manifested as line broadening. In Table 2, data for line broadening together with observed grain sizes are presented.

TABLE 2

| CO % | FWHM*(2θ°) | Line broadening ($B_n/B_0$) | Grain Shape | Grain Size (nm) |
|---|---|---|---|---|
| 0.0 | 0.150 ($B_0$) | 1.0 | columnar | 250** |
| 4.0 | 0.209 | 1.39 | columnar | 150** |
| 6.0 | 0.330 | 2.20 | columnar/equiaxed | 50*** |
| 8.0 | 0.359 ($B_n$) | 2.39 | equiaxed | 10 |

*Full Width at Half Maxium - measuredfrom $K_{α2}$-stripped Gaussian profiles of the 220 reflection of a single MTCVD Ti(C, N) coating.
**Average breadth of the columnar grains. Note that the length can typically be of the order of the coating thickness.
***Mixture of columnar and equiaxed grains. No columnar grains approaching the coating thickness could not be found.

Full Width at Half Maximum of the reference is $B_0$
Full Width at Half Maximum of the reference of the nanograined coating is $B_n$ (n=4.0, 6.0, 8.0)
Line broadening is $B_n/B_0$.

Line broadening is defined as absolute values (°2θ) and as relative values. The line broadening should be from 0.30 to 0.60 °2θ, preferably from 0.33 to 0.4 °2θ, and from 2.0 to 4.0, preferably from 2.2 to 2.7 (relative value, reference MTCVD Ti(C,N)).

The two definitions for line broadening are in this case characterized by the fact that the coating is under slight tensile stresses. The line broadening is consequently solely due to grain size alone and is not due to compressive stresses together with a small grain size as is the case in PVD coatings.

Hardness

Hardness of the coatings 1, 3, 4 and 5 were measured by using nano-indentation technique. The results are presented in Table 3.

TABLE 3

| | CO % | Hardness |
|---|---|---|
| Coating 1 | 0 | 26 |
| Coating 3 | 4.0 | 28 |
| Coating 4 | 6.0 | 29 |
| Coating 5 | 8.0 | 34 |

Coating Chemistry (Incorporation of Oxygen)

The experiments have shown that by doping, considerable amounts of oxygen can be incorporated into the coatings, Table 4. It is clear that the carbon content in the coating is in principle, unaffected by the increase in CO doping. The nitrogen level decreases, while there is a drastic increase in the oxygen content. However, titanium oxides (Magnelli phases) were not found. The stoichiometry of the coating layers increases from 0.88 to 1.03.

TABLE 4

| Composition | Coating 1 | Coating 3 | Coating 4 | Coating 5 |
|---|---|---|---|---|
| C/Ti | 0.55 | 0.54 | 0.54 | 0.54 |
| N/Ti | 0.33 | 0.28 | 0.24 | 0.21 |
| O/Ti | 0.00 | 0.04 | 0.18 | 0.28 |
| (C + N + O)/Ti | 0.88 | 0.86 | 0.96 | 1.03 |

Friction

The friction coefficients between steel (SS1672) and the experimental coatings were measured using a pin-on disk method. Reduced friction could be confirmed, Table 5.

TABLE 5

| | CO % | Friction Coefficient |
|---|---|---|
| Coating 1 | 0 | 0.45 |
| Coating 3 | 4.0 | 0.45 |
| Coating 4 | 6.0 | 0.41 |
| Coating 5 | 8.0 | 0.32 |

Single layers of coatings 1, 3, 4 and 5 were deposited on turning (SNUN120408) and milling SEKN1203 AFN) inserts. All the coating layers had the same thickness of 6 μm. As is clear from Table 6, the nanocrystalline (coating 5) single layers exhibited good wear properties at lower cutting speed in turning. At the highest cutting speed, the coating failed due to plastic deformation, however, with clearly reduced crater, flank wear and chipping as compared to the non-doped coating layer (coating 1). In milling (in this case at medium speed) the nanocrystalline coating (coating 5) exhibited a clearly increased life time and enhanced edge strength (chipping resistance), Table 7.

From the results obtained, it is clear that a combination of nanocrystalline coating layer atop a layer of Ti(C,N), TiN, TiC, $Al_2O_3$ or a combination of these, obviously results in enhanced wear properties, especially when turning at higher

TABLE 6

Turning Stainless Steel (SS 2333)

| | Life time (min) at 185 m/min | Life time (min) at 250 m/min |
|---|---|---|
| Coating 1 | 22 | 16 |
| Coating 3 | 22 | 17 |
| Coating 4 | 25 | 14 |
| Coating 5 | 31 | 9 |

Lifetime criterion: surface finish or flank wear
Feed: 0.4 mm/tooth
Depth of cut: 2.5 mm

TABLE 7

Milling (SS 2333)

| | Cutting Length (mm) | Chipping % |
|---|---|---|
| Coating 1 | 3400 | 12 |
| Coating 3 | 3350 | 9 |
| Coating 4 | 3800 | 9 |
| Coating 5 | 4200 | 4 |

Cutting speed: 200 m/min
Feed: 0.2 mm/tooth
Depth of cut: 2.5 mm

EXAMPLE 2

The nanograined coating layer was applied atop a MTCVD Ti(C,N) layer and atop at Ti(C,N)—Al$_2$O$_3$ multi-coating layer. The coating combinations were the following, Table 8. The coatings 1–4 were deposited on turning (SNUN120408) and milling (SEKN1203 AFN) inserts.

TABLE 8

| | Ti(C,N) | Al$_2$O$_3$ | Equiaxed Nano | Grain Size |
|---|---|---|---|---|
| Coating 1 | 6 μm | — | — | — |
| Coating 2 | 4 μm | — | 2 | 10 nm |
| Coating 3 | 4 μm | 4 | — | — |
| Coating 4 | 4 μm | 4 | 2 | 10 nm |

TABLE 9

Carbon Steel, SS 1672

| | Life time (min) at 185 m/min | Life time (min) at 250 m/min |
|---|---|---|
| Coating 1 | 25 | 16 |
| Coating 2 | 28 | 18 |

Lifetime criterion: ISO 3685

TABLE 10

Stainless Steel, SS 2333

| | Life time (min) at 220 m/min | Edge Chipping (%)** |
|---|---|---|
| Coating 3 | 12* | 22 |
| Coating 4 | 19 | 8 |

*Lifetime criterion ISO 3685
**After 4 min of turning

TABLE 11

Cast Iron, SS 1672

| | Life time (min) at 220 m/min | Edge Chipping (%)** |
|---|---|---|
| Coating 3 | 15* | 16 |
| Coating 4 | 16 | 11 |

*Lifetime criterion ISO 3685
**After 4 min of turning

TABLE 12

Face Milling (SS2377)

| | Cutting Length (mm) | Chipping %** |
|---|---|---|
| Coating 1 | 3400* | 20 |
| Coating 2 | 3350 | 15 |
| Coating 3 | 3800 | 32 |
| Coating 4 | 4200 | 16 |

Cutting Speed: 80 m/min
Feed: 0.6 mm/tooth
Dept of cut: 6 mm
Wet-milling
*Lifetime criterion: surface finish
**After 1800 mm The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A coated body having as a coating layer, a layer of Ti(C,N,O) having a grain size of 25 nm or less, wherein each of C, N and O is present in a non-zero amount, and wherein the layer of Ti(C,N,O) is applied as an outermost layer.

2. The coated body of claim 1 wherein the Ti(C,N,O) layer is applied atop a layer of a compound selected from the group consisting of Ti(C,N), Ti(Al,N), kappa-Al$_2$O$_3$, alpha-Al$_2$O$_3$ and mixtures thereof.

3. The coated body of claim 2 wherein the layers are applied by MTCVD.

4. The coated body of claim 2 wherein the Ti(C,N,O) layer is applied by MTCVD.

5. The coated body of claim 2 wherein the Ti(C,N,O) layer is applied onto an Al$_2$O$_3$ layer which itself has been deposited atop a Ti(C,N) layer.

6. The coated body of claim 5 wherein the Al$_2$O$_3$ layer is an alpha-Al$_2$O$_3$ layer.

7. The coated body of claim 5 wherein the Al$_2$O$_3$ layer is a kappa-Al$_2$O$_3$ layer.

8. The coated body of claim 5 wherein the said Ti(C,N) layer is a multilayer of MTCVD Ti(C,N) and CVD Ti(C,N).

9. The coated body of claim 2 wherein the Ti(Al,N) layer is applied by PVD.

10. The coated body of claim 2 wherein the Ti(C,N) layer is applied by PVD.

11. The coated body of claim 10 wherein the said Ti(C,N) layer is without compressive stress.

12. The coated body of claim 1 wherein the Ti(C,N,O) has a ratio of O/Ti of from 0.10 to 0.40, a ratio of C/Ti of from 0.40 to 0.60 and a ratio of N/Ti of from 0.15 to 0.35.

13. The coated body of claim 1 wherein the body is comprised of a cemented carbide, cermet or ceramic.

14. The coated body of claim 1 wherein the x-ray diffraction half-peak breadth for the coating layer is at least twice that of a layer of Ti(C,N).

15. The coated body of claim 14 wherein the x-ray diffraction half-peak breadth for the coating layer is from 2.25 to 2.50 of that of a layer of Ti(C,N).

16. The coated body of claim 1 wherein the layer of Ti(C,N,O) has an equiaxed grain shape.

17. The coated body of claim, 1 wherein the grain size is 10 nm or less.

18. A coated body having as a coating layer, a layer of Ti(C,N,O) having a grain size of 10 nm or less,
wherein each of C, N and O is present in a non-zero amount and wherein the layer of Ti(C,N,O) is an inner layer having at least one other layer atop the layer of Ti(C,N,O).

19. The coated body of claim 18 wherein there is an outer layer of one or more of $Al_2O_3$, Ti(C,N) and TiN atop the said Ti(C,N,O) layer.

20. The coated body of claim 19 wherein the said outer layer is a multilayer of TiN.

21. The coated body of claim 19 wherein the outer layer is a multilayer of Ti(C,N).

22. The coated body of claim 19 wherein the outer layer is a multilayer of $Al_2O_3$.

23. The coated body of claim 22 wherein the $Al_2O_3$ is kappa-$Al_2O_3$.

24. The coated body of claim 18 wherein the layer of Ti(C,N,O) has an equiaxed grain shape.

* * * * *